United States Patent
Otani

(10) Patent No.: US 9,881,741 B2
(45) Date of Patent: Jan. 30, 2018

(54) MULTILAYER CERAMIC ELECTRONIC COMPONENT

(71) Applicant: Murata Manufacturing Co., Ltd., Nagaokakyo-shi, Kyoto-fu (JP)

(72) Inventor: Shinji Otani, Nagaokakyo (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 64 days.

(21) Appl. No.: 14/944,656

(22) Filed: Nov. 18, 2015

(65) Prior Publication Data
US 2016/0172110 A1    Jun. 16, 2016

(30) Foreign Application Priority Data

Dec. 11, 2014 (JP) ................. 2014-251309
Aug. 26, 2015 (JP) ................. 2015-166701

(51) Int. Cl.
| | | |
|---|---|---|
| H01G 4/30 | (2006.01) |
| H01F 27/29 | (2006.01) |
| H01L 41/047 | (2006.01) |
| H01L 41/293 | (2013.01) |
| H01F 17/00 | (2006.01) |
| H01G 4/232 | (2006.01) |
| H01G 4/012 | (2006.01) |
| H01G 4/12 | (2006.01) |
| H01C 7/00 | (2006.01) |

(52) U.S. Cl.
CPC ............ *H01G 4/30* (2013.01); *H01F 17/0013* (2013.01); *H01F 27/292* (2013.01); *H01G 4/232* (2013.01); *H01G 4/2325* (2013.01); *H01L 41/0472* (2013.01); *H01L 41/293* (2013.01); *H01C 7/008* (2013.01); *H01G 4/012* (2013.01); *H01G 4/12* (2013.01)

(58) Field of Classification Search
CPC .. H01G 4/30; H01G 4/12; H01G 4/10; H01G 4/32; H01G 4/1227
See application file for complete search history.

(56) References Cited

U.S. PATENT DOCUMENTS

| | | | | |
|---|---|---|---|---|
| 2006/0246371 | A1* | 11/2006 | Nishikawa | G03F 7/0382 430/270.1 |
| 2010/0302704 | A1* | 12/2010 | Ogawa | H01G 4/30 361/306.3 |
| 2015/0287532 | A1* | 10/2015 | Abe | H05K 3/3436 174/260 |

FOREIGN PATENT DOCUMENTS

JP    10-284343 A    10/1998

* cited by examiner

*Primary Examiner* — Nguyen Ha
(74) *Attorney, Agent, or Firm* — Keating & Bennett, LLP

(57) ABSTRACT

A multilayer ceramic capacitor includes a ceramic base body and is structured such that fluorine is present between the ceramic base body and a sintered metal layer or between a sintered metal layer and a conductive resin layer.

18 Claims, 4 Drawing Sheets

MULTILAYER CERAMIC ELECTRONIC COMPONENT

BACKGROUND OF THE INVENTION

1. Field of the Invention

The present invention relates to a multilayer ceramic electronic component. In particular, the present invention relates to a multilayer ceramic electronic component including a ceramic base body including inner electrodes buried therein, and outer electrodes disposed on opposite end surfaces of the ceramic base body and electrically connected to the inner electrodes. Examples of such a multilayer ceramic electronic component include multilayer ceramic capacitors, multilayer ceramic inductors, multilayer ceramic thermistors, and multilayer ceramic piezoelectric components.

2. Description of the Related Art

An example of a known multilayer ceramic electronic component is one that includes a ceramic base body having inner electrodes buried therein which are partly exposed on surfaces of the ceramic base body, and outer electrodes which are disposed on the opposite end surfaces of the ceramic base body and each of which includes a sintered electrode layer containing a metal as a main component, a conductive resin electrode layer containing metal particles and disposed on the surface of the sintered electrode layer, and a plating layer disposed on the surface of the conductive resin electrode layer. Such a multilayer ceramic electronic component is disclosed in, for example, Japanese Unexamined Patent Application Publication No. 10-284343. This multilayer ceramic electronic component has the conductive resin electrode layer disposed between the sintered electrode layer and the plating layer. Therefore, the following drawbacks are overcome to some extent: the ceramic base body is susceptible to cracks due to the temperature cycle during use and has a low resistance against deformation of a substrate on which it is mounted.

A multilayer ceramic electronic component such as that described above is structured such that the outer electrodes are disposed on the opposite end surfaces of the ceramic base body. For mounting of the multilayer ceramic electronic component onto a substrate, each of these outer electrodes extends over the edges of the end surface to wrap around adjacent main surfaces. However, the interface between the main surface of the ceramic base body and the edge portion of the outer electrode is susceptible to moisture ingress, and this moisture enters the conductive resin layer.

Such a multilayer ceramic electronic component is soldered to a substrate by reflow. During the reflow process, the moisture in the conductive resin layer may turn into steam and cause splashing of solder. This problematic phenomenon is called "solder splatter".

SUMMARY OF THE INVENTION

Accordingly, preferred embodiments of the present invention provide a multilayer ceramic electronic component that prevents ingress of moisture between a main surface of a ceramic base body and the edge portion of an outer electrode and thus keeping moisture out of the outer electrode.

According to a preferred embodiment of the present invention, a multilayer ceramic electronic component includes a ceramic base body that includes inner electrodes buried therein and first and second main surfaces opposite each other, first and second side surfaces opposite each other, and first and second end surfaces opposite each other, each of the first and second side surfaces being adjacent to the first and second main surfaces, and each of the first and second end surfaces being adjacent to the first and second main surfaces and the first and second side surfaces, outer electrodes which are disposed on the respective first and second end surfaces of the ceramic base body so as to be electrically connected to the inner electrodes and each of which includes an edge portion thereof disposed on the first and second main surfaces and the first and second side surfaces, each of the outer electrodes including a sintered metal layer disposed over the ceramic base body, a conductive resin layer disposed over the sintered metal layer, and a plating layer disposed over the conductive resin layer, and fluorine which is present between the conductive resin layer and each of the first and second main surfaces of the ceramic base body.

According to another preferred embodiment of the present invention, a multilayer ceramic electronic component includes a ceramic base body that includes inner electrodes buried therein and first and second main surfaces opposite each other, first and second side surfaces opposite each other, and first and second end surfaces opposite each other, each of the first and second side surfaces being adjacent to the first and second main surfaces, and each of the first and second end surfaces being adjacent to the first and second main surfaces and the first and second side surfaces, outer electrodes which are disposed on the respective first and second end surfaces of the ceramic base body so as to be electrically connected to the inner electrodes and each of which has an edge portion thereof disposed on the first and second main surfaces and the first and second side surfaces, each of the outer electrodes including a sintered metal layer disposed over the ceramic base body, a conductive resin layer disposed over the sintered metal layer, and a plating layer disposed over the conductive resin layer, and fluorine which is detectable by TOF-SIMS and which is present between the conductive resin layer and each of the first and second main surfaces of the ceramic base body.

A multilayer ceramic electronic component according to a preferred embodiment of the present invention is preferably arranged such that the fluorine is present at the edge portion of each of the outer electrodes.

A multilayer ceramic electronic component according to a preferred embodiment of the present invention is preferably arranged such that the fluorine is present also between the sintered metal layer and the conductive resin layer.

A multilayer ceramic electronic component according to a preferred embodiment of the present invention is preferably arranged such that the fluorine is present also between the ceramic base body and the sintered metal layer.

According to a further preferred embodiment of the present invention, a method for producing a multilayer ceramic electronic component includes preparing a ceramic base body that includes first and second main surfaces opposite each other, first and second side surfaces opposite each other, and first and second end surfaces opposite each other, each of the first and second side surfaces being adjacent to the first and second main surfaces, and each of the first and second end surfaces being adjacent to the first and second main surfaces and the first and second side surfaces, forming a fluorine layer by dipping the ceramic base body in a fluorine solution and drying the fluorine solution on the ceramic base body, thus forming a multilayer body, forming a sintered metal layer by applying a conductive paste to the fluorine layer at each end portion of the multilayer body and baking the conductive paste, forming a conductive resin layer by applying a conductive resin to the sintered metal layer and allowing the conductive resin to cure, and forming a plating layer on the conductive resin layer.

According to still a further preferred embodiment of the present invention, a method for producing a multilayer ceramic electronic component includes preparing a ceramic base body that includes first and second main surfaces opposite each other, first and second side surfaces opposite each other, and first and second end surfaces opposite each other, each of the first and second side surfaces being adjacent to the first and second main surfaces, and each of the first and second end surfaces being adjacent to the first and second main surfaces and the first and second side surfaces, forming a sintered metal layer by applying a conductive paste to each end portion of the ceramic base body and baking the conductive paste, forming a fluorine layer by dipping the ceramic base body including the sintered metal layer formed thereon in a fluorine solution and drying the fluorine solution on the ceramic base body and the sintered metal layer, forming a conductive resin layer by applying a conductive resin to the fluorine layer on the sintered metal layer and allowing the conductive resin to cure, and forming a plating layer on the conductive resin layer.

According to various preferred embodiments of the present invention, it is possible to provide a multilayer ceramic electronic component which has water-repellent fluorine between a main surface of a ceramic base body and a conductive resin layer. Such a multilayer ceramic electronic component prevents ingress of moisture into edge portions of an outer electrode and thus prevents solder splatter when the multilayer ceramic electronic component is soldered to a substrate by reflow.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
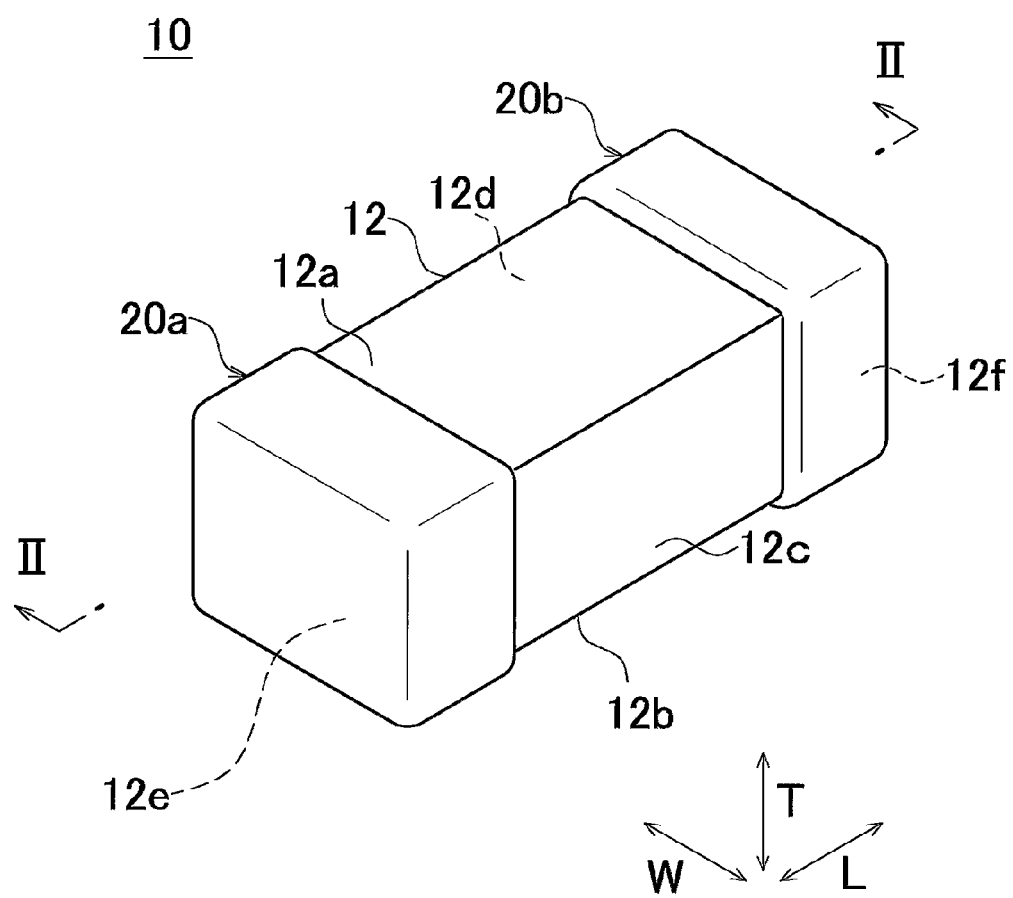
FIG. 1 is a perspective view illustrating one example of a multilayer ceramic capacitor of a preferred embodiment of the present invention.

A multilayer ceramic capacitor 10 shown in FIG. 1 includes a ceramic base body 12 substantially in the shape of a cuboid measuring, for example, about 1 mm×about 0.5 mm×about 0.15 mm. The ceramic base body 12 includes a stack of ceramic layers 14 and first and second main surfaces 12a and 12b opposite each other, first and second side surfaces 12c and 12d opposite each other, and first and second end surfaces 12e and 12f opposite each other. Each of the first and second side surfaces 12c and 12d is adjacent to the first main surface 12a and the second main surface 12b. Each of the first and second end surfaces 12e and 12f is adjacent to the first main surface 12a, the second main surface 12b, the first side surface 12c, and the second side surface 12d. The corners and edges of the ceramic base body 12 preferably are rounded. It should be noted that the ceramic base body 12 may have a different size and shape.

The ceramic layers 14 of the ceramic base body 12 may be made from a ceramic material such as, for example, dielectric ceramics containing $BaTiO_3$, $CaTiO_3$, $SrTiO_3$, $CaZrO_3$, or the like as a main component. Alternatively, the ceramic layers 14 may be made from a ceramic material obtained by adding, to the main component, a secondary component such as a manganese compound, an iron compound, a chromium compound, a cobalt compound, a nickel compound, or the like. The thickness of each of the ceramic layers 14 of the ceramic base body 12 may be, for example, about 0.5 μm to about 10 μm.

Figure 2:
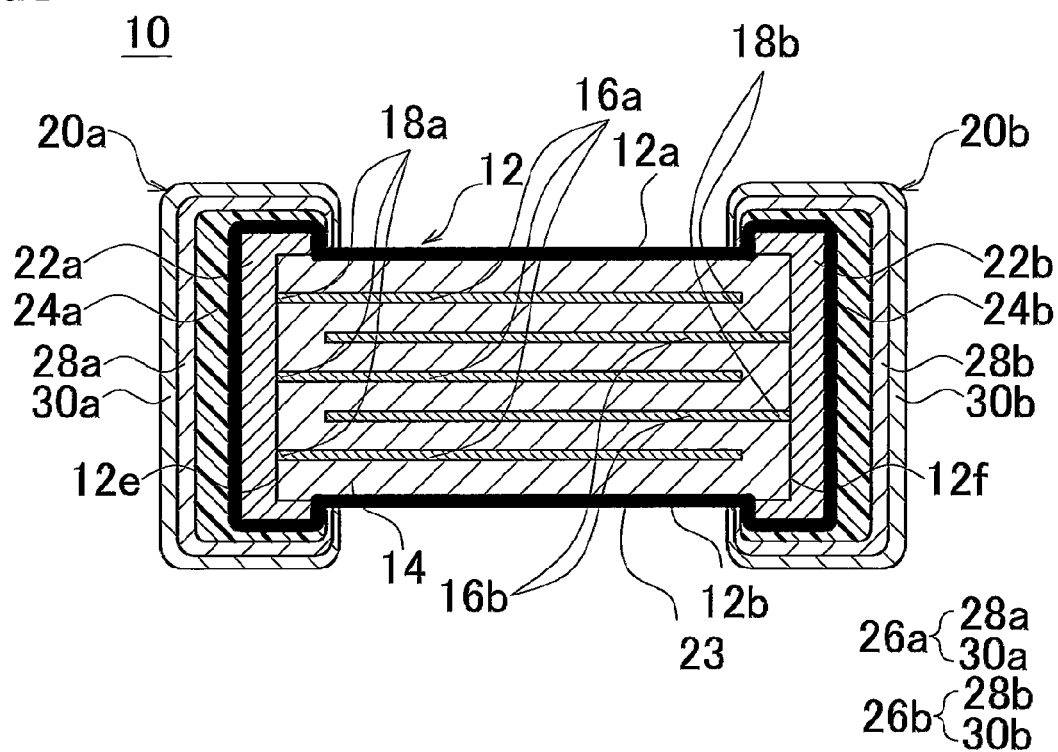
FIG. 2 is a cross-sectional view of the multilayer ceramic capacitor shown in FIG. 1 taken along line II-II in FIG. 1.

The ceramic base body 12 includes, buried therein, a stack of first and second inner electrodes 16a and 16b arranged one above the other in an alternating pattern and equally spaced in the thickness direction of the ceramic base body 12. The first and second inner electrodes 16a and 16b are substantially in the shape of, for example, a rectangle (see FIG. 2).

One end of each of the first inner electrodes 16a includes an exposed portion 18a which is exposed on the first end surface 12e of the ceramic base body 12, and one end of each of the second inner electrodes 16b has an exposed portion 18b which is exposed on the second end surface 12f.

Furthermore, each of the first and second inner electrodes 16a and 16b is parallel or substantially parallel with the first main surface 12a and the second main surface 12b of the ceramic base body 12. The first and second inner electrodes 16a and 16b are stacked in the thickness direction of the ceramic base body 12 in a superimposed manner with the ceramic layers 14 interposed therebetween.

The thickness of each of the first and second inner electrodes 16a and 16b may be, for example, about 0.2 μm to about 2 μm. However, the thickness of each of the first and second inner electrodes 16a and 16b is not particularly limited.

The first and second inner electrodes 16a and 16b contain a conductive material such as nickel, which is an inexpensive metal. The first and second inner electrodes 16a and 16b may be made from, for example, a metal such as nickel, copper, silver, palladium, gold, or the like or an alloy containing at least one of these metals such as a silver-palladium alloy.

The ceramic base body 12 includes a first outer electrode 20a and a second outer electrode 20b on the first end surface 12e and the second end surface 12f, respectively.

The first outer electrode 20a covers the first end surface 12e of the ceramic base body 12 and extends over the edges of the first end surface 12e to wrap around the first and second main surfaces 12a and 12b and the first and second side surfaces 12c and 12d. The first outer electrode 20a disposed like this is electrically connected to the exposed portions 18a of the first inner electrodes 16a.

The second outer electrode 20b covers the second end surface 12f of the ceramic base body 12 and extends over the edges of the second end surface 12f to wrap around the first and second main surfaces 12a and 12b and the first and second side surfaces 12c and 12d. The second outer electrode 20b disposed like this is electrically connected to the exposed portions 18b of the second inner electrodes 16b.

Figure 3:
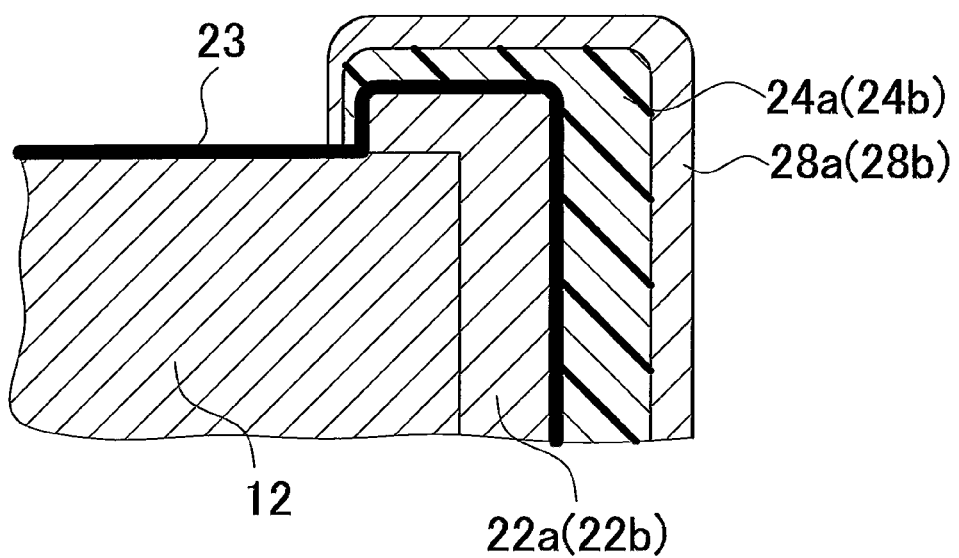
FIG. 3 is an illustration of a structure of the interface between a ceramic base body and an outer electrode of the multilayer ceramic capacitor shown in FIG. 1.

The first outer electrode 20a preferably includes a sintered metal layer 22a disposed on the ceramic base body 12, a fluorine layer 23 disposed on the sintered metal layer 22a, a conductive resin layer 24a disposed on the fluorine layer 23, and a plating layer 26a disposed on the conductive resin layer 24a (see FIG. 3). As with the first outer electrode 20a, the second outer electrode 20b preferably includes a sintered metal layer 22b disposed on the ceramic base body 12, the fluorine layer 23 disposed on the sintered metal layer 22b, a conductive resin layer 24b disposed on the fluorine layer 23, and a plating layer 26b disposed on the conductive resin layer 24b.

Each of the sintered metal layers 22a and 22b contains, as a main component, copper which is an inexpensive metal. The sintered metal layers 22a and 22b are disposed on the outside surfaces (i.e., the first and second end surfaces 12e and 12f, respectively, and the like) of the ceramic base body 12 and physically and electrically connected to the first and second inner electrodes 16a and 16b, respectively. The sintered metal layers 22a and 22b are formed preferably by applying a conductive paste, which contains copper powder and glass powder, to the outside surfaces of the ceramic base body 12 and baking the conductive paste. The thickness of each of the sintered metal layers 22a and 22b preferably is, for example, about 10 µm to about 30 µm.

The fluorine layer 23 is disposed on the sintered metal layers 22a and 22b. That is, the fluorine layer 23 is disposed so as to cover the ceramic base body 12 which has the sintered metal layers 22a and 22b provided thereon. The fluorine layer 23 is formed preferably by applying a fluorine solution to the ceramic base body 12 by dipping the ceramic base body 12, which has the sintered metal layers 22a and 22b thereon, in the fluorine solution and then drying the applied fluorine solution. Non-limiting examples of the fluorine solution include fluorine solutions containing a fluorocopolymer.

The conductive resin layers 24a and 24b on the fluorine layer 23 each contain metal powder as a conductive material. The conductive resin layers 24a and 24b are disposed over the sintered metal layers 22a and 22b, respectively, with the fluorine layer 23a interposed therebetween. The conductive resin layers 24a and 24b are formed preferably by heating a mixture of metal powder and a thermosetting resin and thus allowing the mixture to cure. The thickness of each of the conductive resin layers 24a and 24b is determined depending on, for example, the size of the ceramic base body 12. In the case where the length L, thickness T, and width W of the ceramic base body 12 preferably are about 0.6 mm, about 0.3 mm, and about 0.3 mm, respectively, the thickness of each of the conductive resin layers 24a and 24b may be about 10 µm, for example. In the case where the length L, thickness T, and width W of the ceramic base body 12 are about 1.0 mm, about 0.5 mm, and about 0.5 mm, respectively, the thickness of each of the conductive resin layers 24a and 24b may be about 15 µm, for example. In the case where the length L, thickness T, and width W of the ceramic base body 12 are about 3.2 mm, about 2.6 mm, and about 2.6 mm, respectively, the thickness of each of the conductive resin layers 24a and 24b may be about 80 µm to about 100 µm, for example.

The thermosetting resin contained in the conductive resin layers 24a and 24b is not particularly limited and may be, for example, a phenol resin, an acrylic resin, a silicone resin, an epoxy resin, a polyimide resin, or the like.

The plating layer 26a includes a nickel plating layer 28a and a tin plating layer 30a. As with the plating layer 26a, the plating layer 26b includes a nickel plating layer 28b and a tin plating layer 30b.

The nickel plating layers 28a and 28b are formed preferably by nickel-plating the surfaces of the conductive resin layers 24a and 24b, respectively, and the like. The thickness of each of the nickel plating layers 28a and 28b is, for example, about 1 µm to about 5 µm. The nickel plating layers 28a and 28b define and function as protection layers to prevent solder leaching.

The tin plating layers 30a and 30b are formed preferably by tin-plating the surfaces of the nickel plating layers 28a and 28b, respectively. The thickness of each of the tin plating layers 30a and 30b is, for example, about 1 µm to about 5 µm. The tin plating layers 30a and 230b improve solderability.

In this multilayer ceramic capacitor 10, the conductive resin layers 24a and 24b preferably contain metal particles constituted by metal powder and thus are highly conductive.

Furthermore, in this multilayer ceramic capacitor 10, the sintered metal layers 22a and 22b preferably contain copper and thus are highly conductive.

The fluorine layer 23 is disposed on the sintered metal layers 22a and 22b and includes the conductive resin layers 24a and 24b located thereon. This fluorine layer 23 is formed preferably by applying a fluorine solution onto the sintered metal layers 22a and 22b and drying the fluorine solution, which results in regions that contain fluorine and regions that contain no fluorine. Therefore, in the regions that contain fluorine, the water repellency of fluorine prevents ingress of moisture and, in the regions that contain no fluorine, the sintered metal layer 22a and the conductive resin layer 24a are in electrical communication with each other and the sintered metal layer 22b and the conductive resin layer 24b are in electrical communication with each other. It should be noted that fluorine may be provided by plasma polymerization coating.

Furthermore, in this multilayer ceramic capacitor 10, since the plating layers 26a and 26b include the nickel plating layers 28a and 28b, respectively, the nickel plating layers 28a and 28b prevent moisture and the like from leaking out through the plating layers 26a and 26b. This prevents moisture and the like from leaking out through the plating layers 26a and 26b and splashing with solder (this is called solder splatter) when the multilayer ceramic capacitor 10 is soldered by reflow.

Furthermore, since this multilayer ceramic capacitor 10 is structured such that the first and second outer electrodes 20a and 20b have their edge portions disposed on the first and second main surfaces 12a and 12b of the ceramic base body 12, the multilayer ceramic capacitor 10 is able to be easily mounted on a substrate with the first main surface 12a or the second main surface 12b facing the substrate.

Furthermore, the multilayer ceramic capacitor 10 is structured such that the ceramic base body 12, the sintered metal layer 22a, and the conductive resin layer 24a are separated from one another by the fluorine layer 23 at the edge portion of the first outer electrode 20a; and the ceramic base body 12, the sintered metal layer 22b, and the conductive resin layer 24b are separated from one another by the fluorine layer 23 at the edge portion of the second outer electrode 20b. Since the fluorine layer 23 has water repellency, the fluorine layer 23 prevents ingress of moisture between the ceramic base body 12 and the edge portion of each of the first and second outer electrodes 20a and 20b. This keeps moisture out of the conductive resin layers 24a and 24b. Therefore, when the multilayer ceramic electronic component 10 is soldered to a substrate by reflow, solder splatter, which is caused by evaporation of moisture in the conductive resin layers 24a and 24b, is prevented. It should be noted that whether or not the fluorine layer 23 is present can be determined by checking the presence of fluorine by: grinding down the edge portions of the outer electrodes 20a and 20b on the main surfaces of the ceramic base body 12; removing the edge portions of the outer electrodes 20a and 20b by argon etching; and subjecting the surfaces to TOF-SIMS analysis and checking the peaks.

The TOF-SIMS instrument detects fluorine in the form of ions such as $BaF^+$, $C_3F_3^+$, $C_2F_4^+$, $C_2F_5^+$, and $C_3F_5^+$. The ion $BaF^+$ is most strongly detected. It should be noted that, in the case where a TOF-SIMS instrument "TOF.SIMS5" available from ION-TOF is used, the conditions under which measurement is performed are as follows.

Primary ion: $Bi_3^{++}$ (primary ion energy: 25 kV)
Secondary ion polarity: Positive ion
Measured area: 300 μm×300 μm
Number of scanning operations: 16
Number of pixels: 128

Figure 4:
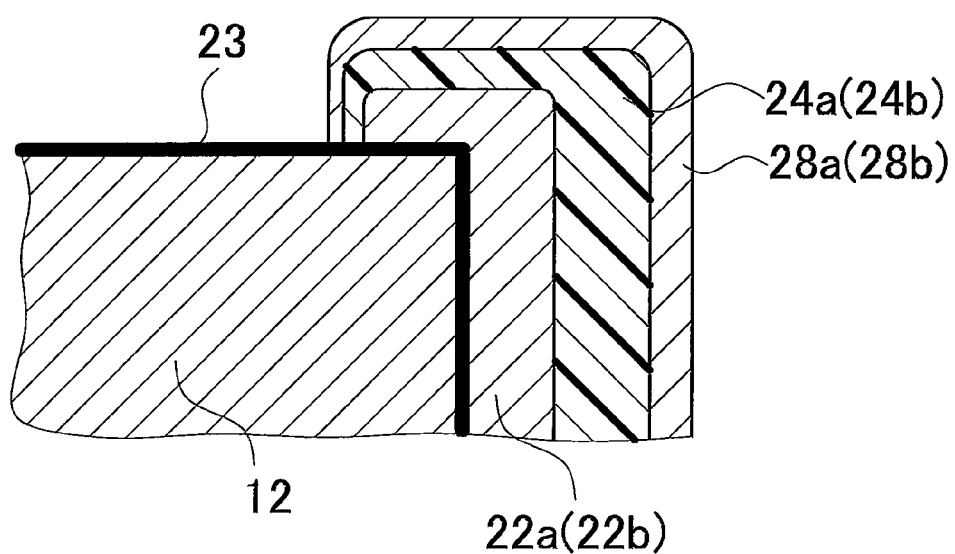
FIG. 4 is an illustration of another structure of the interface between the ceramic base body and the outer electrode of the multilayer ceramic capacitor shown in FIG. 1.

It should be noted that the fluorine layer 23 may be formed on the surface of the ceramic base body 12 before the sintered metal layers 22a and 22b are formed. In this case, at one end portion of the ceramic base body 12, the fluorine layer 23 lies between the ceramic base body 12 and the sintered metal layer 22a and covers an end of the conductive resin layer 24a and, at the other end portion, the fluorine layer 23 lies between the ceramic base body 12 and the sintered metal layer 22b and covers an end of the conductive resin layer 24b (see FIG. 4). That is, the conductive resin layer 24a is enclosed by the fluorine layer 23, the sintered metal layer 22a, and the plating layer 26a, and the conductive resin layer 24b is enclosed by the fluorine layer 23, the sintered metal layer 22b, and the plating layer 26b. Therefore, moisture is kept out of the conductive resin layers 24a and 24b.

The fluorine layer 23 does not need to cover the entire end surfaces of the ceramic base body 12 and the entire surfaces of the sintered metal layers 22a and 22b, respectively, provided that the conductive resin layer 24a is separated from the ceramic base body 12 by the fluorine layer 23 at the edge portion of the first outer electrode 20a and the conductive resin layer 24b is separated from the ceramic base body 12 by the fluorine layer 23 at the edge portion of the second outer electrode 20b. This is enough to prevent ingress of moisture into the conductive resin layers 24a and 24b.

The following is a description of one non-limiting example of a method for producing the above-described multilayer ceramic capacitor 10.

First, ceramic green sheets are prepared. The ceramic green sheets contain a ceramic material for the ceramic layers 14 of the ceramic base body 12.

Next, a conductive paste is applied to the ceramic green sheets to thus form conductive patterns. The conductive paste can be applied by, for example, various printing methods such as screen printing method. The conductive paste may contain a known binder, solvent, and/or the like in addition to conductive fine particles.

Next, ceramic green sheets having no conductive patterns thereon, ceramic green sheets having formed thereon conductive patterns corresponding to the first inner electrodes and ceramic green sheets having formed thereon conductive patterns corresponding to the second inner electrodes arranged in an alternating pattern, and ceramic green sheets having no conductive patterns thereon are stacked in this order, and pressed in the thickness direction, whereby a mother laminate is prepared.

Next, the mother laminate is cut along imaginary lines into a plurality of green ceramic laminates. The mother laminate can be cut with a dicing machine, a hand cutter, or the like. The obtained green ceramic laminates may be subjected to barrel polishing or the like so that the edges and corners are rounded.

Then, the green ceramic laminates are baked. In this baking process, the first inner electrodes and the second inner electrodes are baked. The baking temperature may be determined appropriately depending on the types of ceramic material and conductive paste used here. The baking temperature may be, for example, about 900° C. to 1300° C.

Each of the ceramic laminates (ceramic base bodies) thus obtained is dipped in a fluorine solution and dried so that a fluorine layer is formed between the ceramic base body and a sintered metal layer.

Then, a conductive paste is applied to each end portion of the baked ceramic laminate (ceramic base body) by dipping or the like.

Next, the conductive paste applied to the ceramic laminate is hot-air dried at, for example, about 60° C. to 180° C. for about 10 minutes.

After that, the dried conductive paste is baked, whereby sintered metal layers are formed.

In the case where the fluorine layer is to be formed between a sintered metal layer and a conductive resin layer, the ceramic base body having the sintered metal layer formed thereon, instead of the ceramic base body alone, is dipped in the fluorine solution.

Then, the conductive resin layer is nickel-plated and then tin-plated so that a plating layer made up of a nickel plating layer and a tin plating layer is formed. In this way, a multilayer ceramic capacitor 10 is produced.

As described earlier, a multilayer ceramic electronic component having a fluorine layer, such as the multilayer ceramic capacitor 10 structured as described above, prevents ingress of moisture at edge portions of each outer electrode because of the water repellency of fluorine which is present between the main surface of the ceramic base body and each conductive resin layer. This keeps moisture out of the conductive resin layers and thus prevents solder splatter when the multilayer ceramic electronic component is soldered to a substrate by reflow.

If such a multilayer ceramic electronic component has fluorine between the sintered metal layer and the conductive resin layer, the conductive resin layer is confined more firmly and ingress of moisture into the conductive resin layer is prevented.

Even if fluorine lies between the sintered metal layer and the ceramic base body, the conductive resin layer is firmly confined and ingress of moisture into the conductive resin layer is prevented.

EXAMPLES

First, twenty multilayer ceramic capacitors having a fluorine layer between a ceramic base body and a sintered metal layer and twenty multilayer ceramic capacitors having a fluorine layer between a sintered metal layer and a conductive resin layer were prepared as Examples.

Furthermore, twenty multilayer ceramic capacitors having no fluorine layers were prepared as Comparative Examples.

Each of these multilayer ceramic capacitors was soldered to a substrate by reflow. As a result, in Comparative Examples, ingress of moisture into the conductive resin layers was observed, and fifteen out of twenty capacitors caused solder splatter. On the other hand, in Examples, solder splatter did not occur.

In the above-described preferred embodiments and Examples, each of the first and second outer electrodes has its edge portions disposed on the main surfaces and side surfaces of the ceramic base body. However, the side surfaces of the ceramic base body do not need to have the first and second outer electrodes disposed thereon, provided that the end surfaces of the ceramic base body have the respective first and second outer electrodes disposed thereon and at least either the first main surface or the second main surface of the ceramic base body has the edge portions of the first and second outer electrodes disposed thereon. A multilayer ceramic electronic component including first and second outer electrodes disposed like this is able to be easily mounted on a substrate with the first main surface or the second main surface, which has the edge portions of the outer electrodes disposed thereon, facing the substrate.

Furthermore, although each of the plating layers in the above-described preferred embodiments and Examples preferably is constituted by a nickel plating layer and a tin plating layer, the plating layers may be constituted by a single plating layer or three or more plating layers, for example.

Although each of the ceramic base bodies in the above-described preferred embodiments and Examples preferably is made from dielectric ceramics, the ceramic base body of the present invention may be made from magnetic ceramics such as ferrite, semiconductor ceramics such as spinel ceramics, piezoelectric ceramics such as PZT ceramics, or the like, depending on the types of multilayer ceramic electronic component, for example.

A multilayer ceramic electronic component including a ceramic base body made from magnetic ceramics defines and functions as a multilayer ceramic inductor, a multilayer ceramic electronic component including a ceramic base body made from semiconductor ceramics defines and functions as a multilayer ceramic thermistor, and a multilayer ceramic electronic component including a ceramic base body made from piezoelectric ceramics functions as a multilayer ceramic piezoelectric component. It should be noted, however, that, in the case where the multilayer ceramic electronic component defines and functions as a multilayer ceramic inductor, the inner electrodes define a coil conductor.

Ceramic electronic components according to various preferred embodiments of the present invention are suitable for use as, in particular, a multilayer ceramic capacitor, a multilayer ceramic inductor, a multilayer ceramic thermistor, a multilayer ceramic piezoelectric component, or the like, for example.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A multilayer ceramic electronic component comprising:
a ceramic base body that includes inner electrodes buried therein and first and second main surfaces opposite each other, first and second side surfaces opposite each other, and first and second end surfaces opposite each other, each of the first and second side surfaces being adjacent to the first and second main surfaces, and each of the first and second end surfaces being adjacent to the first and second main surfaces and the first and second side surfaces;
outer electrodes which are disposed on the respective first and second end surfaces of the ceramic base body so as to be electrically connected to the inner electrodes and each of which includes an edge portion disposed on the first and second main surfaces and the first and second side surfaces, each of the outer electrodes including a sintered metal layer disposed on the ceramic base body, a conductive resin layer disposed on the sintered metal layer, and a plating layer disposed on the conductive resin layer; and
fluorine which is present between the conductive resin layer and each of the first and second main surfaces of the ceramic base body; wherein
the fluorine is a plasma polymerization coating; and
the fluorine is present only between the conductive resin layer and the first and second main surfaces of the ceramic base body, or between the conductive resin layer and the first and second main surfaces of the ceramic base body and only in a portion of a region between the conductive resin layer and the first and second end surfaces of the ceramic base body.

2. The multilayer ceramic electronic component according to claim 1, wherein the fluorine is present at the edge portion of each of the outer electrodes.

3. The multilayer ceramic electronic component according to claim 1, wherein the fluorine is present between the sintered metal layer and the conductive resin layer.

4. The multilayer ceramic electronic component according to claim 1, wherein the fluorine is present between the ceramic base body and the sintered metal layer.

5. The multilayer ceramic electronic component according to claim 1, wherein the multilayer ceramic electronic component is one of a multilayer ceramic capacitor, a multilayer ceramic inductor, a multilayer ceramic thermistor, and a multilayer ceramic piezoelectric component.

6. The multilayer ceramic electronic component according to claim 1, wherein the fluorine contains a fluorocopolymer.

7. The multilayer ceramic electronic component according to claim 1, wherein the conductive resin layer includes metal particles.

8. The multilayer ceramic electronic component according to claim 1, wherein the sintered metal layer includes copper.

9. The multilayer ceramic electronic component according to claim 1, wherein the plating layer includes nickel.

10. A multilayer ceramic electronic component comprising:
a ceramic base body that includes inner electrodes buried therein and first and second main surfaces opposite each other, first and second side surfaces opposite each other, and first and second end surfaces opposite each other, each of the first and second side surfaces being adjacent to the first and second main surfaces, and each of the first and second end surfaces being adjacent to the first and second main surfaces and the first and second side surfaces;
outer electrodes which are disposed on the respective first and second end surfaces of the ceramic base body so as to be electrically connected to the inner electrodes and each of which includes an edge portion disposed on the first and second main surfaces and the first and second side surfaces, each of the outer electrodes including a sintered metal layer disposed on the ceramic base body, a conductive resin layer disposed on the sintered metal layer, and a plating layer disposed on the conductive resin layer; and fluorine which is detectable by TOF-SIMS and which is present between the conductive resin layer and each of the first and second main surfaces of the ceramic base body; wherein the fluorine is a plasma polymerization coating; and the fluorine is present only between the conductive resin layer and the first and second main surfaces of the ceramic base body, or between the conductive resin layer and the first and second main surfaces of the ceramic base body and only in a portion of a region between the conductive resin layer and the first and second end surfaces of the ceramic base body.

11. The multilayer ceramic electronic component according to claim 10, wherein the fluorine is present at the edge portion of each of the outer electrodes.

12. The multilayer ceramic electronic component according to claim 10, wherein the fluorine is present between the sintered metal layer and the conductive resin layer.

13. The multilayer ceramic electronic component according to claim 10, wherein the fluorine is present between the ceramic base body and the sintered metal layer.

14. The multilayer ceramic electronic component according to claim 10, wherein the multilayer ceramic electronic component is one of a multilayer ceramic capacitor, a multilayer ceramic inductor, a multilayer ceramic thermistor, and a multilayer ceramic piezoelectric component.

15. The multilayer ceramic electronic component according to claim 10, wherein the fluorine contains a fluorocopolymer.

16. The multilayer ceramic electronic component according to claim 10, wherein the conductive resin layer includes metal particles.

17. The multilayer ceramic electronic component according to claim 10, wherein the sintered metal layer includes copper.

18. The multilayer ceramic electronic component according to claim 10, wherein the plating layer includes nickel.

* * * * *